(12) United States Patent
Temme et al.

(10) Patent No.: US 9,706,606 B2
(45) Date of Patent: Jul. 11, 2017

(54) INDUCTION FURNACE AND SYSTEM FOR LOCATING A GROUND FAULT THEREIN

(71) Applicant: ABP INDUCTION SYSTEMS GMBH, Dortmund (DE)

(72) Inventors: Ingolf Temme, Menden (DE); Daniel Green, Clark, NJ (US)

(73) Assignee: ABP INDUCTION SYSTEMS GMBH, Dortmund (DE)

( * ) Notice: Subject to any disclaimer, the term of this patent is extended or adjusted under 35 U.S.C. 154(b) by 116 days.

(21) Appl. No.: 14/440,476

(22) PCT Filed: Nov. 7, 2013

(86) PCT No.: PCT/DE2013/000661
§ 371 (c)(1),
(2) Date: May 4, 2015

(87) PCT Pub. No.: WO2014/071913
PCT Pub. Date: May 15, 2014

(65) Prior Publication Data
US 2015/0276843 A1    Oct. 1, 2015

(30) Foreign Application Priority Data

Nov. 9, 2012  (DE) .................... 10 2012 021 904
Feb. 19, 2013  (DE) .................... 10 2013 002 795

(51) Int. Cl.
*H05B 6/06* (2006.01)
*H05B 6/28* (2006.01)
(Continued)

(52) U.S. Cl.
CPC ............. *H05B 6/28* (2013.01); *G01R 31/025* (2013.01); *H05B 6/067* (2013.01); *F27D 2021/0057* (2013.01)

(58) Field of Classification Search
CPC .. H05B 6/067; H05B 6/22; H05B 6/28; F27B 14/061; F27B 14/10; F27B 14/14;
(Continued)

(56) References Cited

U.S. PATENT DOCUMENTS 4,293,730 A   10/1981  Myers
4,525,665 A    6/1985  Smalley
(Continued)

FOREIGN PATENT DOCUMENTS

DE    EP 1818638 A2 *  8/2007  ............ F27B 14/061
EP    1818638 A       8/2007
GB    2205011 A      11/1988

*Primary Examiner* — Hung D Nguyen
(74) *Attorney, Agent, or Firm* — Andrew Wilford

(57) ABSTRACT

A method and an apparatus for detecting a ground fault in an induction furnace as well as an induction furnace are described. When a ground fault is detected by means of the ground-fault detector the ground fault is localized. By doing this it is determined if the ground fault is caused by a failure of the refractory lining or by other reasons. If the ground fault is caused by other reasons it is ascertained if it is caused by a defective magnetic yoke insulation. Furthermore, it can be ascertained which magnetic yoke of the induction furnace causes a ground fault. In this manner the induction furnace can be operated with improved security and smaller expense.

11 Claims, 3 Drawing Sheets

(51) Int. Cl.
*G01R 31/02* (2006.01)
*F27D 21/00* (2006.01)

(58) Field of Classification Search
CPC ....... F27B 14/20; F27D 19/00; G01R 31/025;
G01R 31/08
USPC ... 373/60, 70, 102, 104, 107, 108, 138, 144,
373/145, 147, 148, 149, 150, 155, 156,
373/159
See application file for complete search history.

(56) References Cited

U.S. PATENT DOCUMENTS

| | | |
|---|---|---|
| 5,606,480 A | 2/1997 | Nevo |
| 2013/0285670 A1* | 10/2013 | Yoshidomi ........... G01R 31/025 324/510 |

* cited by examiner

INDUCTION FURNACE AND SYSTEM FOR LOCATING A GROUND FAULT THEREIN

CROSS REFERENCE TO RELATED APPLICATIONS

This application is the US-national stage of PCT application PCT/DE2013/000661 filed 7 Nov. 2013 and claiming the priority of German patent application 102012021904.0 itself filed 9 Nov. 2012 and German patent application 102013002795.0 itself filed 19 Feb. 2013.

FIELD OF THE INVENTION

The present invention is directed to a method of detecting a ground fault in an induction furnace having an induction furnace jacket with a refractory lining and an induction coil surrounding same and at least one bath ground electrode in the lower part of the refractory lining as well as a ground-fault detector.

BACKGROUND OF THE INVENTION

Such a method is known. In this method it is determined by means of the ground-fault detector if a ground fault is present in the system. Such a ground-fault detector or supervising means is connected to the induction coil and includes, for instance, a signal source and a comparator that measures the resistance to ground of the induction coil and its power supply circuit. The means has a window comparator with an adjustable upper and lower limit that compares the measured resistance against upper and lower thresholds. If the measured resistance drops below the lower limit, the ground-fault detector provides an alarm that shuts the power down and signals to the operator that there is a ground fault. If the measured resistance increases above the upper limit, the ground-fault detector provides an alarm that shuts the power down and signals to the operator that the ground resistance measurement circuit is defective.

Such a ground fault can be generated by a connection between the coil and ground, between the power supply and ground or between other electrically live components located outside the coil and ground. Furthermore, a ground fault can belong to the induction furnace coil or power supply or other electrically live components located outside the coil. Moreover, a coil ground fault can be caused by penetration of the molten metal through the refractory lining. In this case, a path to ground is provided by the at least one bath ground electrode.

A problem with the prior art of such a ground-fault detector or controllers of induction furnaces is that the occurrence of a ground fault is only detected and indicated, however, it is not indicated where the ground fault occurs. In the case of a ground fault the operator has to examine corresponding zones in the range of the furnace for the search of defects. However, this is time consuming and expensive.

OBJECT OF THE INVENTION

It is the object of the present invention to provide a method of the above-cited kind that results in an increased security with regard to the operation of the furnace.

SUMMARY OF THE INVENTION

According to the invention this object is achieved with a method of the cited kind by localizing the ground fault upon the determination of a ground fault by means of the ground-fault detector.

Accordingly, with the inventive method it is not only detected or determined that a ground fault has occurred but the corresponding ground fault is also localized. In other words, according to the invention it is determined where the ground fault has occurred. When doing this it is especially localized whether the ground fault is caused by a failure of the refractory lining or by other reasons. Particularly, it is ascertained whether the ground fault is caused by penetration of the bath metal melt of the furnace through the refractory lining to the induction coil.

Preferably, according to the invention the ground fault is localized by isolating the at least one bath ground electrode from ground and checking if the ground fault exists further or not.

Accordingly, the reason for the ground fault has not to be detected manually as this is the case with the known ground-fault detector. If a ground fault is determined by means of the ground-fault detector that exists further after shut down of the furnace the shut down signal of the ground fault measurement is rather checked once again according to the invention. If in this case it is determined that the ground fault exists further the at least one bath ground electrode is isolated from ground. If doing this has the result that then the ground fault is no more indicated, a defect in the refractory lining exists since the coil current (check current) through the direct contact with the metal bath can no more flow to ground through the bath ground electrode on account of the defective refractory lining. However, if the ground fault exists further after the isolation of the bath ground electrode from ground it is determined that the ground fault has other reasons or the defect exists outside of the refractory lining.

Accordingly, by switching off or switching on the ground connection of the at least one bath ground electrode the ground fault can be localized by being able to determine whether it is based on a failure of the refractory lining, for example by penetration of the refractory lining by the metal melt and contact of same with the coil, or on other reasons that have nothing to do with the refractory lining.

According to a further development of the inventive method of localizing a ground fault upon determination that the ground fault is caused by other reasons, it is ascertained if the ground fault is caused by a defective magnetic yoke insulation. If the ground fault exists further the power supply is switched on for a short time in order to examine whether an external ground fault is present that occurs only if voltage is present. If the ground fault recurs the fault "external ground fault" is indicated and all the yoke isolation switching devices associated with the magnetic yokes are opened together. If the fault does no more exist then the fault "yoke insulation fault" is indicated.

In prosecution of the inventive method then it is ascertained which magnetic yoke of the induction furnace causes a ground fault. When doing this, all the magnetic yoke isolation switching devices are closed and the yoke isolation switching devices are then automatically opened one after the other. Each time when a yoke isolation switching device is opened it is checked if the ground fault does no more exist. If this occurs a fault message "yoke number insulation fault" can be displayed. The method can be continued until all the yokes have been individually checked.

Preferably, the inventive method of localizing a ground fault is used in combination with a method according to which the intactness of the at least one bath ground electrode is checked. With checking the intactness of the bath ground electrode herewith also the checking of the electrical connection between the melt bath and the corresponding grounding is meant. This method supplies the additional security that the ground fault detecting through the at least one bath ground electrode functions correctly.

Preferably, according to this method of checking the intactness a low DC current or AC current is applied to another insulated electrode extending through the furnace bottom and in connection with the melt wherein this current flows from this electrode through the melt bath to the at least one bath ground electrode to ground, and this current is measured after melting of the charge, especially continuously, and compared with a reference value. If the current drops below the reference value an alarm signal indicating a defect of the bath ground electrode is generated. Preferably, the power supply of the furnace is shut off.

In this manner according to the inventive method it is insured that the ground-fault detector of the induction furnace has the ability to provide a ground fault alarm in the case of a penetration of the metal melt through the refractory lining of the induction furnace. This forms the basis of the inventive method of the localization of the occurred ground fault.

Furthermore, the invention is directed to an apparatus for carrying out the above-described method. The apparatus is characterized by the feature that it includes means for localizing a determined ground fault. Particularly, the means for localizing ascertains whether the ground fault is caused by a failure of the refractory lining or by other reasons. Especially, the means ascertains if the ground fault is caused by penetration of the bath metal melt of the furnace through the refractory lining to the induction coil.

Particularly, the means for localizing includes a switching device, especially a relay, for isolating the at least one bath ground electrode from ground. According to a further development the means for localizing includes a plurality of switching devices, especially relays, for isolating the magnetic yokes from ground.

Preferably, the inventive apparatus includes means for checking the intactness of the at least one bath ground electrode. Advantageously, this apparatus can be defined in such a manner that it comprises an additional insulated electrode extending through the furnace bottom, a low voltage source for the application of a low DC current or AC current to the additional electrode, means for measuring this current, means for comparing the magnitude of this current with a reference value and means for generating an alarm signal if the current drops below the reference value.

Furthermore, the invention is related to an induction furnace comprising an induction furnace jacket (1) with a refractory lining designed for the reception of a bath melt, an induction coil (3) surrounding and supporting the refractory lining (2) and formed in such a manner that it heats the bath melt in an inductive manner when a current is applied, and an apparatus for determining a ground fault with at least one bath ground electrode in the lower part of the refractory lining, a ground-fault detector and means for localizing a determined ground fault.

BRIEF DESCRIPTION OF THE DRAWING

In the following the invention is described by means of examples in connection with the drawing in detail. Of the drawing

SPECIFIC DESCRIPTION OF THE INVENTION

Figure 1:
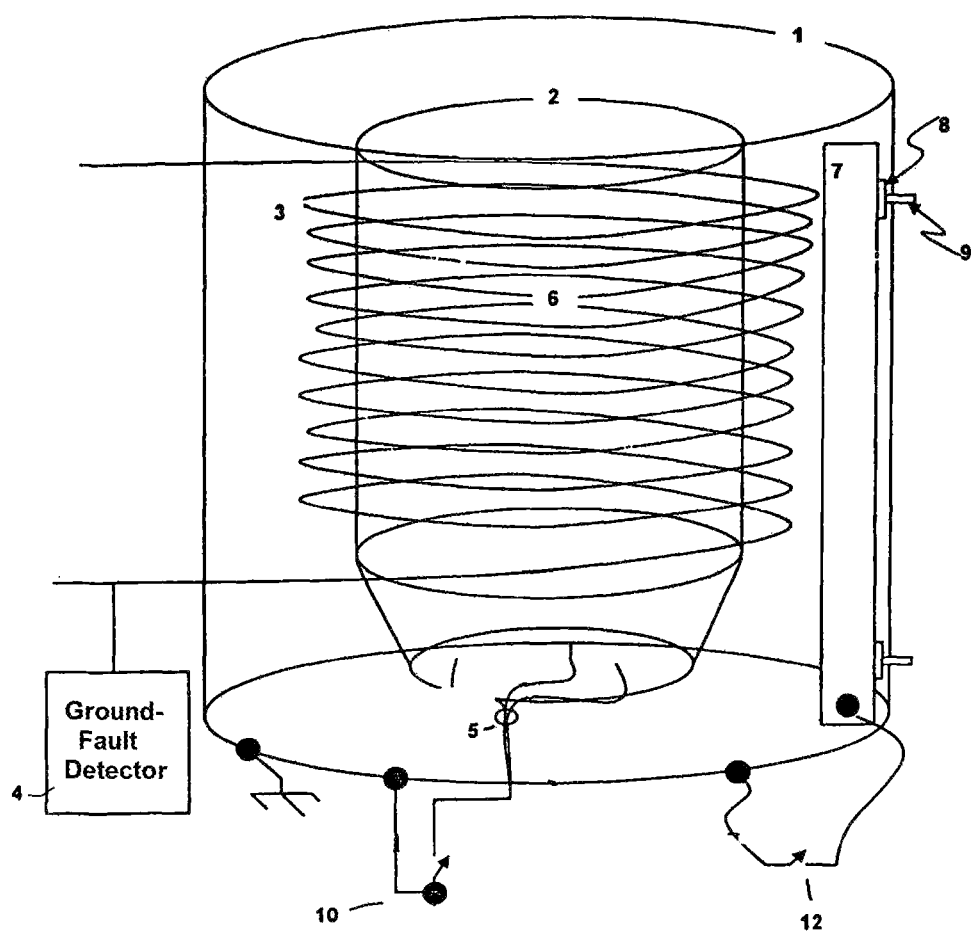
FIG. 1 shows a schematic representation of an induction furnace that is provided with a ground-fault detector as well as an apparatus for localizing a ground fault.

The induction furnace schematically shown in FIG. 1 includes an induction furnace jacket 1 comprising a refractory lining 2 that is surrounded and supported by an induction coil 3. The refractory lining 2 contains a bath of a metal melt that is molten in the induction furnace. Moreover, the induction furnace 3 is supported by several magnetic yokes 7 that are supported by insulating pads 8 that are held under compression by yoke bolts 9. The function of the magnetic yokes is to confine the magnetic field produced by the induction coil 3 and prevent it from overheating the furnace jacket and also to mechanically support the induction coil 3.

The insulating pads 8 are placed between the yokes and their jacking bolts to enable a ground fault that is external to the furnace coil to be located to a specific yoke.

The induction furnace has a ground-fault detector or monitoring means 4 connected to the induction coil 3. The means comprises a signal source and a comparator that measures the resistance to ground of the induction coil and its power supply circuit (not shown in FIG. 1). The ground-fault detector has a window comparator with an adjustable upper and lower limit that compares the measured resistance against upper and lower thresholds. If the measured resistance drops below the lower limit the ground fault detector provides an alarm that shuts the power down and signals the operator that there is a ground fault. If the measured resistance increases above the upper limit the ground detector provides an alarm that shuts the power down and signals to the operator that the ground resistance measurement circuit is defective.

Such a ground fault can be caused by a connection between coil and grounding, between the power supply and ground or between other electrically live components located outside the coil and ground. Furthermore, a ground fault can belong to the induction furnace coil or power supply or other electrically live components external to the coil. Moreover, a coil ground fault can be caused by penetration of the metal melt through the refractory lining. In this case a ground connection is provided by the bath ground electrodes 5 of the bath.

In order to be able to localize an occurred ground fault a switching device 10 as relay is provided in the ground connection of the bath ground electrode 5. The bath ground electrode 5 can be isolated from ground by this switching device.

The ground-fault detector 4 determines the occurrence of a ground fault and shuts off the furnace automatically if a ground fault occurs. If the ground fault further exists after the furnace has been shut off the shut off signal of the ground-fault detector 4 is checked once again. For this, the relay of the switching device 10 is opened if the ground fault exists further. If the ground fault is no more indicated then (on account of the isolating from ground) a defect in the refractory lining exists since now the current flow from the coil through the refractory lining and the metal bath and the bath ground electrode 5 to ground is interrupted. However, if the ground fault exists further the defect is located external to the refractory lining or is caused by other reasons.

Furthermore, it can be determined automatically whether a ground fault external to the furnace is caused by one or more magnetic yokes, and moreover it can be determined which specific yoke causes the defect. For this, special yoke isolating devices 12 as relays are provided.

Figure 3:
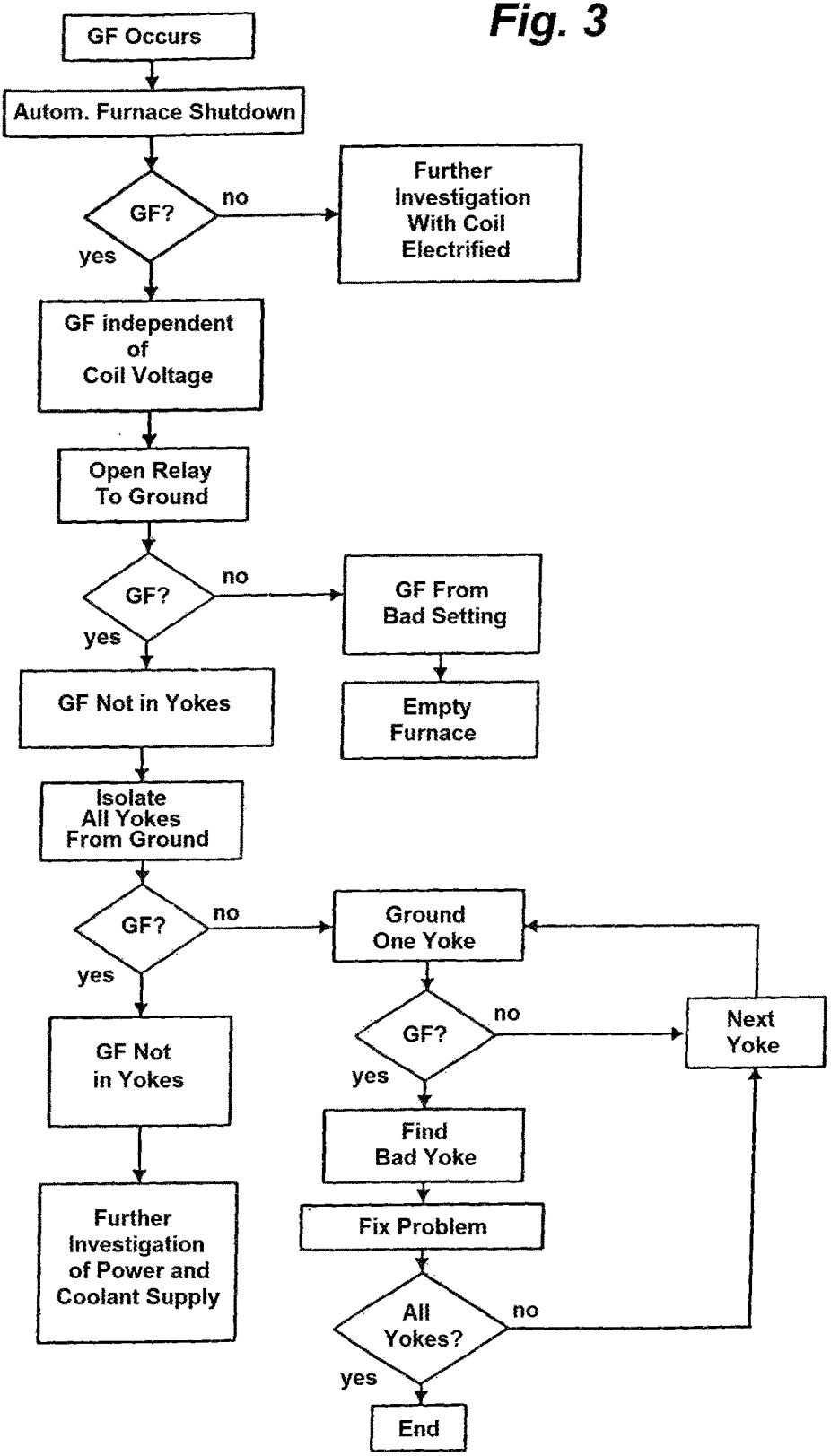
FIG. 3 shows a flow chart for the realization of the method of localizing a ground fault.

The sequence of the method of localizing a ground fault is shown in the flow chart of FIG. 3. If the induction furnace operates normally no ground faults and alarms are present. The switching device (relay) 10 and the yoke isolating switching devices (relays) 12 are closed. However, if a ground fault occurs the system produces a ground fault alarm signal that shuts off the power to the furnace. The control system then automatically opens the switching device 10. If the ground fault goes away the system displays the fault "defect in the refractory lining". If the ground fault does not go away then the system turns on the power supply for a short time to check if there is an external ground fault that occurs only when voltage is present. If the ground fault recurs the system displays the fault "external ground fault" and then opens all of the yoke isolating devices 12 together. If the fault goes away the system displays the fault "yoke insulation fault". The system then closes all of the switching devices 12 and sequently opens the switching devices 12 automatically. Normally, several yokes (four or more) are present wherein the number of yoke isolation switching devices 12 correspond to the number of yokes. Each time a yoke isolation switching device is opened the system checks to see if the ground fault has gone away. If that occurs then the system displays a fault message "insulation fault yoke number" where number is the yoke identification number. This test sequence is continued until all of the yokes are individually checked.

A problem with known kinds of ground fault monitoring systems of induction furnaces is that there is no automatic possibility to ascertain whether the bath ground electrodes are intact and/or produce a good electrical contact to the melt bath. The intactness of this connection is a necessary precondition for the ground-fault detector 4 to be capable of sensing that the metal melt has penetrated through the refractory lining 2 and has come into contact with the induction coil 3. The capability for detecting such a penetration is of essential importance for the safe operation of an induction furnace.

Figure 2:
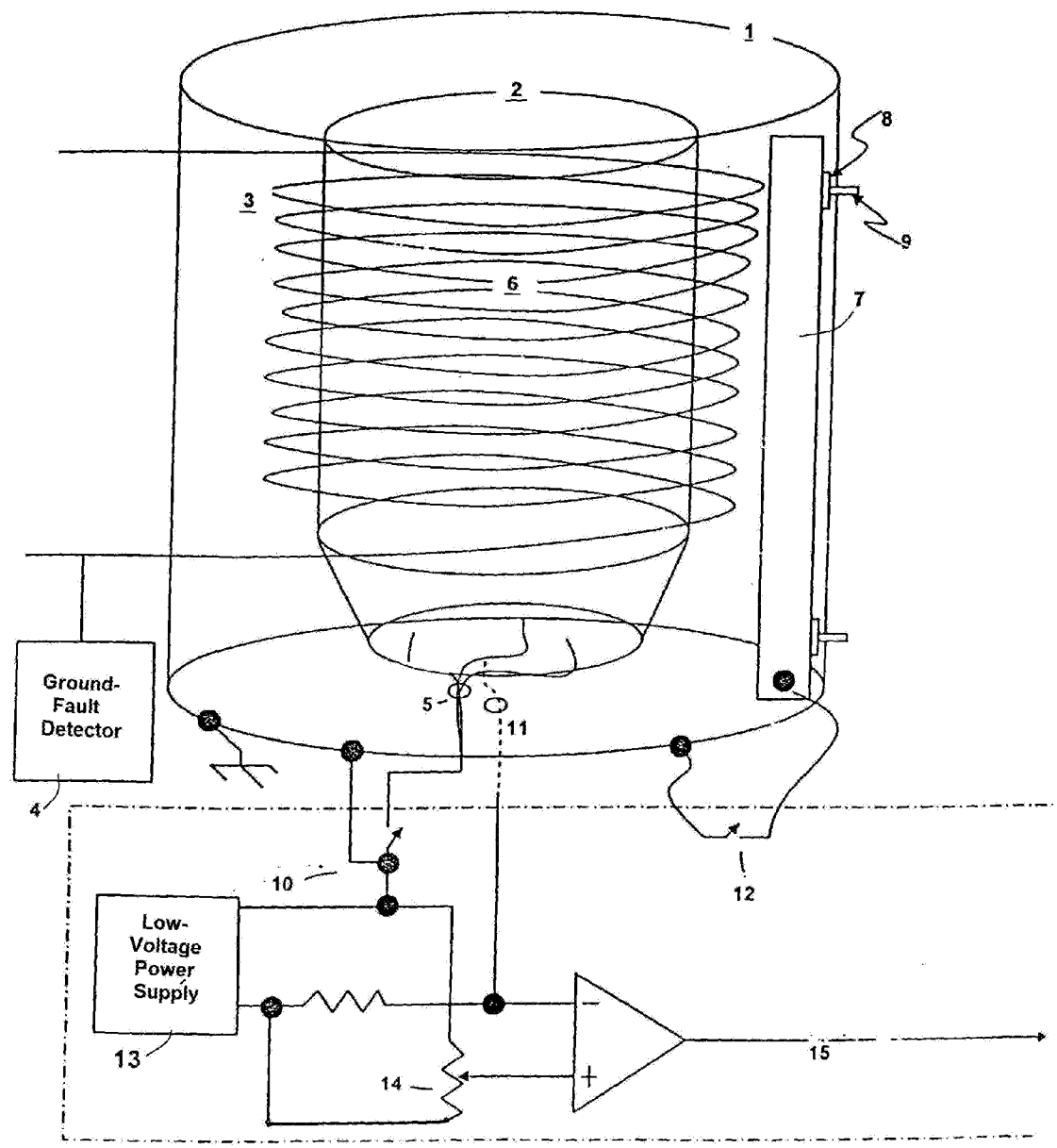
FIG. 2 shows a schematic representation of an induction furnace corresponding to FIG. 1 that is additionally provided with an apparatus for automatically detecting the intactness of a bath ground electrode.

FIG. 2 shows an induction furnace that has means for checking the intactness of the at least one bath ground electrode 5 in addition to means for localizing a ground fault. This means checks automatically whether the bath ground electrodes are intact and/or whether the electrically conductive connection between the metal melt bath 6 and the bath ground electrodes 5 is maintained. This is achieved by means of an additional insulated electrode 11 that extends through the bottom of the furnace. A low DC current or AC current of a low voltage source 13 is passed by means of this electrode 11 through the melt bath into the remaining electrodes 5 to ground. The magnitude of this current is continuously measured and compared with a reference value 14 in order to insure that the current remains above a preset minimum level. If the magnitude of this current decreases below the reference value an alarm signal 15 is provided in order to shut down the power to the furnace and provide a warning to the furnace operator that the grounding of the furnace melt bath is defective. This method insures that the ground detection (ground-fault detector 4) of the induction furnace is able to provide a ground fault alarm in the event of penetration of the metal melt through the refractory lining of the induction furnace.

The invention claimed is:

1. A method of detecting a ground fault in an induction furnace that has
   an induction furnace jacket with a refractory lining and
   an induction coil surrounding the refractory lining,
      at least one bath ground electrode in the lower part of the refractory lining and
   a ground-fault detector connected between ground and the coil,
   the method comprising the steps, while energizing the coil to heat and melt a body of metal held in the refractory lining, of:
   determining with the detector whether the ground fault exists between the coil and ground;
   localizing the determined ground fault by isolating the one bath ground electrode; and,
   when isolating the one bath ground eliminates the ground fault, determining that the ground fault exists from a leak defect in the jacket.

2. The method according to claim 1, wherein the method comprises the step of:
   ascertaining whether the ground fault is caused by penetration of the bath metal melt of the furnace through the refractory lining to the induction coil.

3. The method according to claim 1, wherein upon determination that the ground fault is caused by other reasons it is ascertained whether the ground fault is caused by a defective magnetic yoke insulation.

4. The method according to claim 1, wherein the method comprises the step of:
   ascertaining which magnetic yoke of the induction furnace causes a ground fault.

5. The method according to claim 4, wherein for detecting a magnetic yoke ground fault successively all the magnetic yokes are isolated from ground and it is checked whether the ground fault exists further or not after isolation of a magnetic yoke.

6. The method according to claim 1, wherein the method includes the step of:
   examining the intactness of the at least one bath ground electrode.

7. The method according to claim 6, wherein the intactness of the bath ground electrode is examined by the steps of:
   applying a low DC or AC current to an additional insulated electrode extending through the bottom of the furnace and connected to the melt such that this DC or AC current flows from this electrode through the melt bath to the at least one bath ground electrode to ground,
   then measuring this current after melting of the charge,
   comparing the measured current with a reference value, and
   issuing an alarm signal indicating a defect of the bath ground electrode if the current falls below the reference value.

8. An induction furnace comprising
   an induction furnace jacket with a refractory lining designed for holding a bath melt,
   an induction coil surrounding and supporting the refractory lining and designed in such a manner that it heats the bath melt in an inductive manner when a current is applied, and
   an apparatus for determining a ground fault with
      at least one bath ground electrode in the lower part of the refractory lining,
      a ground-fault detector connected between ground and the coil, and
      means for, when a ground fault is detected by the detector, isolating the bath ground electrode from ground and for, when isolating the bath ground electrode eliminates the detected ground fault, localizing the determined ground fault to the refractory lining.

9. The furnace according to claim 8, wherein there is a plurality of the switch for isolating magnetic yokes of the coil from ground.

10. The furnace according to claim 8, further comprising:
means for examining the intactness of the at least one bath ground electrode.

11. The furnace according to claim 8, further comprising an additional insulated electrode extending through the furnace bottom,
a low voltage source for applying a low DC current or AC current at the additional electrode,
means for measuring this current,
means for comparing this current with a reference value, and
means for generating an alarm signal when the current falls below the reference value.

* * * * *